United States Patent

[11] 3,568,001

[72] Inventor Sam Straus
101-15 Avenue J, Brooklyn, N.Y. 10236
[21] Appl. No. 814,387
[22] Filed Apr. 8, 1969
[45] Patented Mar. 2, 1971

[54] SNAP-ON BOARD MATING CONTACT SYSTEM
4 Claims, 3 Drawing Figs.

[52] U.S. Cl. ........................................................ 317/101, 339/17

[51] Int. Cl. ........................................................ H05k 1/04

[50] Field of Search ............................................ 317/101, 101 (D), 101 (M), 101 (CC); 29/626, 624; 339/18 (C), 220 (T), 174 (X), 17 (M), 17

[56] References Cited

UNITED STATES PATENTS

| | | | |
|---|---|---|---|
| 2,913,634 | 11/1959 | Scoville | 29/626 |
| 3,179,913 | 4/1965 | Mittler et al. | 317/101(UX) |
| 3,423,716 | 1/1969 | Deakin | 339/220T(UX) |

FOREIGN PATENTS

| | | | |
|---|---|---|---|
| 822,623 | 10/1959 | Great Britain | 29/624 |
| 70,102 | 10/1958 | France | 339/18C(UX) |

*Primary Examiner*—David Smith, Jr.
*Attorney*—Constantine A. Michalos

ABSTRACT: A miniature snap-on board mating contact system operable for connecting two or more circuit boards in a parallel arrangement in one push-on action or for disconnecting them in one pulloff action and wherein a male contact of one circuit board connects a predetermined number of female contacts of other circuit boards to electrically interconnect points in a predetermined number of electronic circuits on a predetermined number of circuit boards, each contact assembly includes a male contact or pin of a predetermined length that extends to or through a desired predetermined number of female contacts or sockets for connecting any number of desired points in any number of desired electronic circuits of a number of desired circuit boards.

PATENTED MAR 2 1971 3,568,001

SAM STRAUS

*INVENTOR.*

BY

Constantine A. Michalos

ATTORNEY

SNAP-ON BOARD MATING CONTACT SYSTEM

BACKGROUND OF THE INVENTION

This invention relates generally to electronic contact systems and more particularly to a miniature snap-on board mating contact system for use in connecting two or more points in two or more electronic circuits in two or more circuit boards in a parallel spaced type arrangement.

Contact of this type are used to interconnect the wiring of several printed circuit boards.

Heretofore, it has been the practice to connect each individual input-output of one circuit board with input-output of another circuit board by means of individually wiring each connection between the two circuit boards and soldering each connection individually. This method of connecting circuit boards was long, tedious, and costly. Alternately, all input-output points had to be brought to the edge of each printed circuit board to be connected to a connector. This connector was in turn wired to another connector where the wiring of the next printed circuit board was finally contacted.

As a result of the recent trend in the electronic art, miniaturization and reliability has increased in the aeronautical and space electronics. These trends, combined with the complexity of a large number of interconnected points between circuits, increased the need for an efficient means of interconnecting a plurality of circuit boards. Further, due to the increased use of transistors, integral circuits and other semiconductor devices in computers and general information processing and communication equipment, the level of the electronic signals shifted from a high power level to a relatively low signal power level.

This system instituted the use of a positive contact between the circuit boards. By use of the contact arrangement of this invention one integral part of an electrical equipment of one electronic circuit of one circuit board can be readily connected with another electrical equipment of other electronic circuits of other circuit boards to present a continuity in the transmission line.

The trend for modular design continues due to the complexity of the new computers and data processing equipment; and thus the trend persists for building independent functional circuit boards which can be interconnected with other similar boards to function as a systems assembly to produce a selected desired result.

These trends combined with the complexity of a need for a large number of interconnected boards together with the demand for high reliability make the use of this type of interconnection between circuit boards mandatory.

Therefore, it is an object of this invention to provide an improved miniature snap-on board mating contact arrangement having means for resiliently locking together two or more electronic circuits on two or more circuit boards.

Another object of this invention is to provide for a miniature contact connection system having male contacts or pins and female contacts or sockets in two or more electronic circuits using more than one circuit board wherein each electronic circuit of each circuit board is interconnected by these male-female contacts at one push-on action for maximum strength and minimum electrical contact resistance.

Another object of this invention is to provide for miniature contacts to interconnect an electronic circuit of a circuit board to other electronic circuits of other circuit boards wherein each contact has a minimum number of parts and is so constructed that the two or more circuit boards may be assembled or disassembled with minimum effort.

A further object of this invention is to provide for a miniature snap-on board mating contact system that can connect two or more circuit boards in a parallel spaced arrangement in one push-on action or for disconnecting them in one pulloff action and wherein a male contact of one electronic circuit of one circuit board can connect a predetermined number of female contacts or sockets of other electronic circuits of other circuit boards to electrically interconnect points in a predetermined number of electronic circuits whereby each connector assembly has a male contact or pin of a predetermined length that extends to or through a desired predetermined number of female contacts or sockets for connecting any number of desired points in any number of desired electronic circuits of any number of circuit boards.

Other objects and features of the invention will appear as the description of the particular physical embodiment selected to illustrate the invention progresses. In the accompanying drawing, which forms a part of this specification, like characters of reference have been applied to corresponding parts throughout the several views which make up the drawing.

Figure 3:
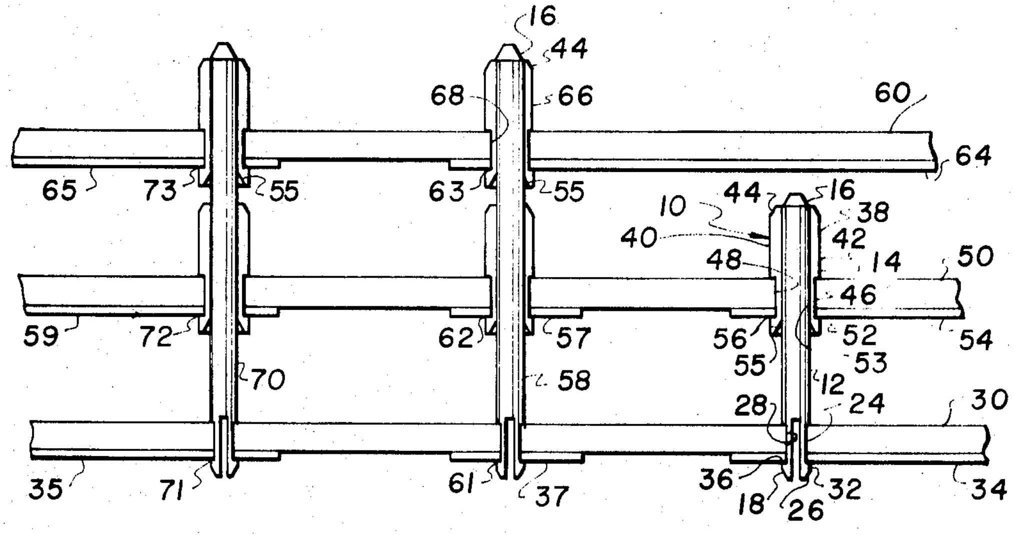
FIG. 3 is a sectional view showing male contacts or pins in association with the female contacts or sockets for assembling two or more electronic circuits on two or more circuit boards.

Referring to FIG. 3 of the drawing a snap-on board mating contact assembly 10 is shown comprised of a male type of radio frequency miniature contact or pin 12 in association with a female-type radio frequency miniature contact or socket 14.

Figure 1:
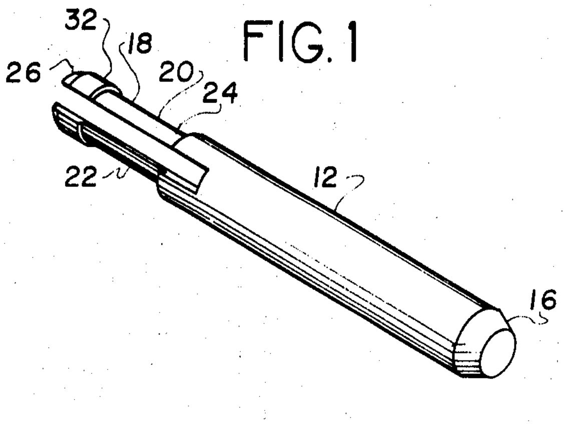
FIG. 1 is a perspective view of the male contact or pin of the miniature snap-on board mating contact system in accordance with a preferred embodiment of this invention.

In addition, referring to FIG. 1, the male contact or pin 12 includes a frontal conical end 16 and a split rear portion 18 having opposed convex reeds 20 and 22. The reeds 20 and 22 combine to form a circular groove 24 and a rear conical end 26 for insertion within a hole 28 of a circuit board 30.

The male contact or pin 12 also includes an enlarged rear portion 32 having the conical end 26 used in attaching to an electronic circuit 34, such as by soldering at point 36 after having inserted the rear conical end 26 into the hole 28 of the circuit board 30 and pushing this end through to exit on the other side of the printed circuit board to snap into the board.

Figure 2:
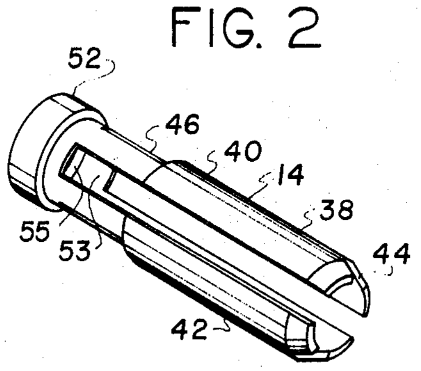
FIG. 2 is a perspective view of the female contact or socket in accordance with the same embodiment of the invention.

In addition, referring to FIG. 2, the female contact or socket 14 also includes a split front portion 38 having opposed convex-concave reeds 40 and 42 with a frontal conical end 44. The reeds 40 and 42 also include a circumferential groove 46 formed on their convex external surface for use in supporting the female contact or socket 14 within a hole 48 of a second circuit board 50. In addition, the female contact or socket 14 includes an enlarged circumferential portion 52 with an opening 53 having a conical internal end 55 coaxial to and coextending from the concave internal surface of the reeds to receive the male pin 12. The groove 46, with the enlarged portion 52, is used in interconnecting the female contact or socket 14 within the hole 48 such as by soldering it onto a second electronic circuit 54 at point 56 located on the circuit board 50.

It should be understood that the soldering is made after pushing the split portion 38 through hole 48 until the contact snaps into the board.

Further, as shown in FIG. 3, the invention includes a longer length male contact or pin 58 used to connect a third circuit board 60 and a third electronic circuit 64 by inserting a female contact or socket 66 of the same size and configuration of the female contact or socket 14 within a hole 68 of the circuit board 60.

The longer length male contact or pin 58 can be made the length shown in FIG. 3 or of any length desired to connect a predetermined number of female contacts or sockets, such as socket 14, of a predetermined number of points on a predetermined number of electronic circuits of a predetermined number of circuit boards.

As shown in FIG. 3, the male contact or pin 58 is used to connect three electrical points 61, 62, and 63 of electronic circuits 37, 57, and 64 of circuit boards 30, 50 and 60 respectively.

In addition, as shown in FIG. 3, a male contact or pin 70 of the same length of the male contact or pin 58 connects points 71, 72, and 73 of electronic circuits 35, 59, and 65 of the circuit boards 30, 50, and 60 respectively.

As best shown in the drawing, one feature of the invention is the configuration of the male and female contacts affording:

1. Quick insertion and snap-in action of the female contact or socket 14 within the circuit board holes, such as holes 48 and 68, by use of the conical frontal end 44 of the female contact;
2. Quick insertion and snap-in action of the male contact or pin 12 through the hole 28 of the circuit board 30 by use of its rear conical end 26; and
3. Quick engagement of the male contacts to the female contacts in one push-on action by use of the male frontal conical end 16, and the conical end 55 of the female contact.

This allows for any number of male contacts or pins to be inserted within any number of female contacts or sockets in any number of circuit boards with one push-on application while firmly, and in proper alignment, holding one circuit board parallel with the others. It should be understood that, when desired, these male and female contacts can be utilized in any multiple connection operation and are not limited to circuit boards.

The invention described may therefore be varied in construction within the scope of the claim, for the particular device selected to illustrate the invention is but one of many possible embodiments of the same. The invention, therefore, is not to be restricted to the precise details of the structure shown and described.

I claim:

1. A miniature snap-on board mating contact system for connecting a plurality of electronic circuit boards in a parallel arrangement comprising an electronic circuit supported by a circuit board, said circuit board having a plurality of holes at predetermined location points of the electronic circuit, a male contact or pin connected at selected predetermined location points of said electronic circuit on said circuit board, and a female contact or socket having a split conical internal end portion with opposed reeds having concave internal surfaces, said male contact or pin operably inserted and connected within said reeds, said male contact or pin further comprising two end portions, a conical extreme end at said fist end portion operably inserted and connected within the hole of one circuit board of the electronic circuit, and a conical frontal end at the second end portion operably inserted and connected within the opening and concave internal surfaces of the reeds of said female socket, whereby one electronic circuit of one circuit board is connected to the other electronic circuits of other circuit boards through said male and female contacts.

2. The structure of claim 1 wherein said female contact further comprises two end portions having opposed convex-concave reeds, the conical extreme end of said first end portion operably inserted and connected within a second board wherein said male frontal conical end is inserted within said female contact for securely interconnecting said second board to said first board.

3. The structure of claim 1 wherein said reeds of said male contact include an enlarged end portion forming a circumferential groove operably inserted and connected within the hole of the said first circuit board to produce a firm and secure connection of said male contact on said first circuit board by said male concave reeds.

4. The structure of claim 2 wherein said female contact includes an enlarged circumferential portion forming a circumferential groove operably inserted and connected within the hole of said second circuit board to produce a firm and secure connection of said female contact on said second circuit board by said female reeds.